(12) United States Patent
Caron et al.

(10) Patent No.: US 10,459,487 B2
(45) Date of Patent: Oct. 29, 2019

(54) SUPPORT FOR AN ELECTRONIC DEVICE AND METHOD OF USING THE SAME

(71) Applicants: FZ ENGINEERING, Montreal (CA); Guy Caron, Boucherville (CA); Mykolai Dutkewych, Ormstown (CA); Frédéric Poulin, Granby (CA)

(72) Inventors: Guy Caron, Boucherville (CA); Mykolai Dutkewych, Ormstown (CA); Frédéric Poulin, Granby (CA)

( * ) Notice: Subject to any disclaimer, the term of this patent is extended or adjusted under 35 U.S.C. 154(b) by 0 days.

(21) Appl. No.: 16/037,729

(22) Filed: Jul. 17, 2018

(65) Prior Publication Data

US 2019/0018452 A1   Jan. 17, 2019

Related U.S. Application Data

(60) Provisional application No. 62/604,655, filed on Jul. 17, 2017.

(51) Int. Cl.
*G06F 1/16* (2006.01)
*H05K 5/02* (2006.01)

(52) U.S. Cl.
CPC .......... *G06F 1/1632* (2013.01); *G06F 1/1626* (2013.01); *H05K 5/0204* (2013.01)

(58) Field of Classification Search
CPC ... G06F 1/1632; G06F 1/1626; H05K 5/0204; F16M 11/00; F16M 11/10; F16M 13/022; B60R 11/02; B60R 11/0241; A45F 5/00
USPC ....................................................... 224/483
See application file for complete search history.

(56) References Cited

U.S. PATENT DOCUMENTS

| | | | | |
|---|---|---|---|---|
| D739,853 S | * | 9/2015 | Lee | D14/253 |
| 9,249,924 B1 | * | 2/2016 | Martin | F16M 13/02 |
| D766,886 S | * | 9/2016 | Lee | D14/253 |
| 2010/0237208 A1 | * | 9/2010 | Di Lollo | A47J 47/16 248/213.2 |
| 2012/0037771 A1 | * | 2/2012 | Kitchen | G06F 1/1632 248/223.41 |
| 2013/0175426 A1 | * | 7/2013 | Harjani | F16M 11/041 248/688 |
| 2016/0095236 A1 | * | 3/2016 | Zhou | F16M 11/041 |
| 2017/0314732 A1 | * | 11/2017 | Minn | F16M 13/022 |

* cited by examiner

*Primary Examiner* — Steven T Sawyer
*Assistant Examiner* — Sagar Shrestha
(74) *Attorney, Agent, or Firm* — Gonzalo Lavin (57) ABSTRACT

The present disclosure relates to a support for an electronic device. The support comprises an elongated main body which defines a main body first surface, a main body second surface found opposite the main body first surface, a main body first end, and a main body second end found the main body first end. The support further comprises a first grasping portion which extends from the main body first end in a direction opposite the main body first surface, a second grasping portion which extends from the main body second end in a direction opposite the main body first surface, and a device securing portion which extends from the elongated main body in a direction opposite the main body second surface. The device securing portion together with the elongated main body defines first and second securing notches for receiving the electronic device according to two different positions.

15 Claims, 8 Drawing Sheets

SUPPORT FOR AN ELECTRONIC DEVICE AND METHOD OF USING THE SAME

CROSS-REFERENCE TO RELATED APPLICATIONS

This application claims priority from U.S. Provisional Application No. 62/604,655 filed on Jul. 17, 2017.

TECHNICAL FIELD

The present description relates to supports for electronic devices such as, without limitation, smartphone devices, tablets, GPS devices and other such devices. More particularly, the present description relates to integrally formed supports adapted to receive a plurality of electronic devices.

BACKGROUND

Many different types of supports adapted to receive electronic devices are known for their use in vehicles and at home. These supports are usually specific to one application or to one device only. As for example, a specific support may be needed for a specific smartphone device (and may not work properly with other such devices). A specific support may further be needed to interact with a specific structure, the air vent of a vehicle for example (and may not work properly with other such structures).

Additionally, some of the universal supports found on the market are composed of elaborated clamping mechanisms to hold the electronic device in place as well as to secure the support in a desired location, which limit their use.

Accordingly, there is a need for an improved universal support that is adapted to easily receive/support an electronic device and further that is adapted to easily interact with a plurality of different structures.

SUMMARY

It is an object of the present disclosure to provide a support for an electronic device that overcomes or mitigates one or more disadvantage(s) of known supports or at least provides a useful alternative.

According to an embodiment, there is provided a support for an electronic device, the support comprising: an elongated main body defining: a main body first surface; a main body second surface opposite the main body first surface; a main body first end; and a main body second end opposite the main body first end; a first grasping portion extending from the main body first end in a direction opposite the main body first surface; a second grasping portion extending from the main body second end in a direction opposite the main body first surface, the first and second grasping portions together defining a grasping passage; and a device securing portion extending from the elongated main body in a direction opposite the main body second surface, the device securing portion together with the elongated main body defining a securing notch for receiving the electronic device.

According to another embodiment, there is provided the support as defined above, wherein the first grasping portion comprises: a first grasping portion distal end; a first grasping portion outer surface; a first grasping portion inner surface opposite the first grasping portion outer surface; and a plurality of elongated channels about the first grasping portion inner surface and the first grasping portion distal end.

According to a further embodiment, there is provided the support as defined above, wherein the first grasping portion defines a substantially elongated and curved shape.

According to yet another embodiment, there is provided the support as defined above, wherein the second grasping portion comprises: a second grasping portion distal end; a second grasping portion inner surface; and a second grasping portion outer surface opposite the second grasping portion inner surface, the second grasping portion outer surface comprising a substantially flat surface for supporting the elongated main body above a surface.

According to another embodiment, there is provided the support as defined above, wherein the second grasping portion distal end is at a distance from the first grasping portion distal end.

According to a further embodiment, there is provided the support as defined above, wherein the second grasping portion defines a substantially planar shape.

According to yet another embodiment, there is provided the support as defined above, wherein the elongated main body, the first grasping portion, the second grasping portion and the device securing portion are integrally made of a flexible material, thereby allowing the first and second grasping portions to be pried apart in order to grasp a structure and attach thereon.

According to another embodiment, there is provided the support as defined above, wherein the device securing portion comprises: a securing main portion extending from the elongated main body, the securing main portion defining: a securing main portion distal end; a securing main portion first surface; and a securing main portion second surface; a first securing portion extending from the securing main portion distal end in a direction opposite the securing main portion first surface, the first securing portion together with the securing main portion first surface and part of the main body second surface defining a first securing notch for receiving the electronic device; and a second securing portion extending from the securing main portion distal end in a direction opposite the securing main portion second surface, the second securing portion together with the securing main portion second surface and part of the main body second surface defining a second securing notch for receiving the electronic device.

According to a further embodiment, there is provided the support as defined above, wherein the first securing portion defines a first securing portion inner surface, the first securing portion inner surface being at a first angle with the securing main portion first surface.

According to yet another embodiment, there is provided the support as defined above, wherein the first angle is less than 90°.

According to another embodiment, there is provided the support as defined above, wherein the second securing portion defines a second securing portion inner surface, the second securing portion inner surface being at a second angle with the securing main portion second surface.

According to a further embodiment, there is provided the support as defined above, wherein the second angle is less than 90°.

According to yet another embodiment, there is provided the support as defined above, wherein the first and second angles are about 45°.

According to another embodiment, there is provided the support as defined above, wherein the flexible material comprises at least one of: a thermoplastic polyurethane material, a silicone material, an ethylene propylene diene terpolymer material and a rubber material.

According to a further embodiment, there is provided the support as defined above, wherein the electronic device defines a device first surface, a device second surface opposite the device first surface, and four edges joining the device first and second surfaces together, and further wherein when the electronic device is received within the first securing notch: the main body second surface interfaces with part of one of: the device first surface and the device second surface; part of the securing main portion first surface interfaces with part of one of the four edges; and part of the first securing portion inner surface interfaces with part of the other one of: the device first surface and the device second surface.

According to yet another embodiment, there is provided the support as defined above, wherein when the electronic device is received within the second securing notch: the main body second surface interfaces with part of one of: the device first surface and the device second surface; part of the securing main portion second surface interfaces with part of one of the four edges; and part of the second securing portion inner surface interfaces with part of the other one of: the device first surface and the device second surface.

According to another embodiment, there is provided the support as defined above, wherein the first securing portion further defines a first securing portion outer surface, the first securing portion outer surface together with the first securing portion inner surface defining a first securing curved surface, and further wherein when the electronic device is received within the first securing notch, the first securing curved surface interfaces with part of the other one of: the device first surface and the device second surface.

According to a further embodiment, there is provided the support as defined above, wherein the first securing portion outer surface is substantially parallel to the securing main portion first surface.

According to yet another embodiment, there is provided the support as defined above, wherein the second securing portion further defines a second securing portion outer surface, the second securing portion outer surface together with the second securing portion inner surface defining a second securing curved surface, and further wherein when the electronic device is received within the second securing notch, the second securing curved surface interfaces with part of the other one of: the device first surface and the device second surface.

According to a further embodiment, there is provided the support as defined above, wherein the second securing portion outer surface is substantially parallel to the securing main portion second surface.

BRIEF DESCRIPTION OF THE DRAWINGS

Further features and advantages of the present disclosure will become apparent from the following detailed description, taken in combination with the appended drawings, in which.

DETAILED DESCRIPTION

Figure 1:
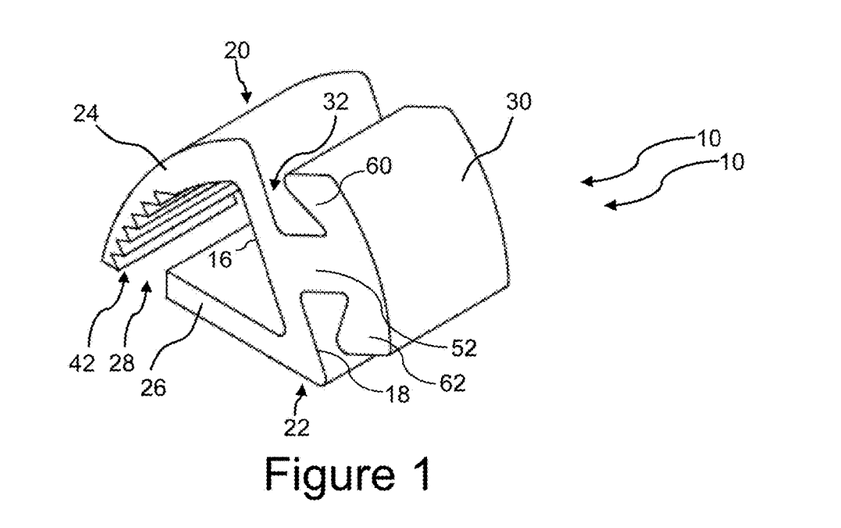
FIG. 1 is a perspective view of a support for an electronic device in accordance with an embodiment.
Figure 2:
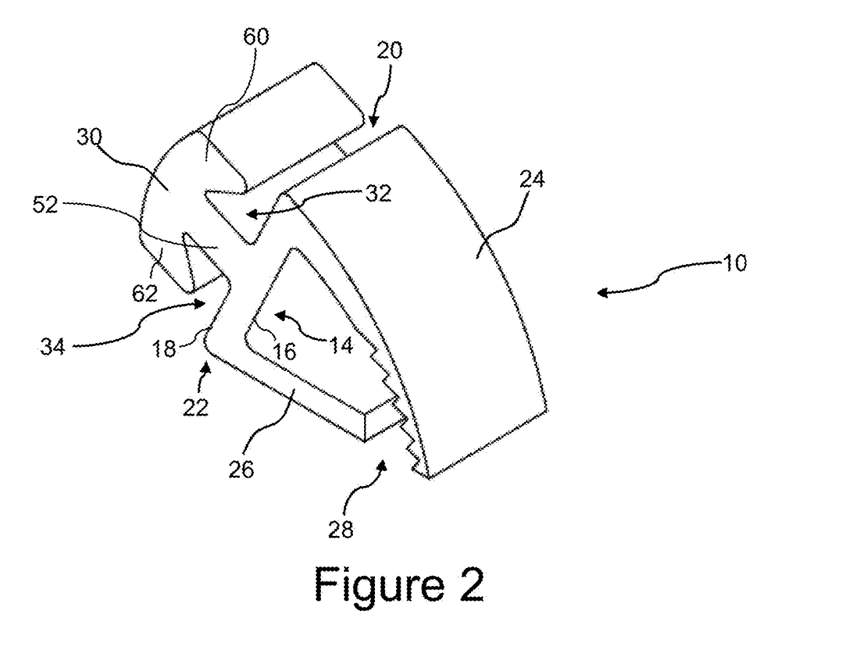
FIG. 2 is another perspective view of the support shown in FIG. 1.
Figure 3:
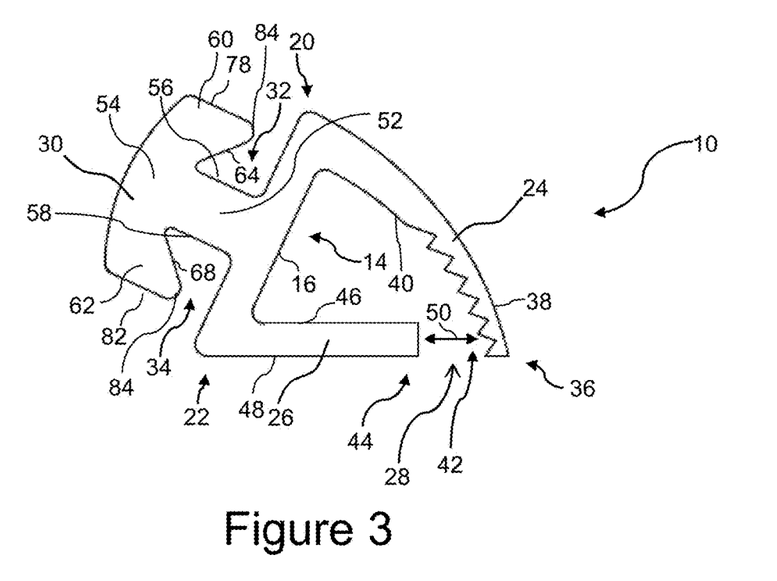
FIG. 3 is a side elevation view of the support shown in FIG. 1.

Referring now to the drawings and more particularly to FIGS. 1-3, there is shown a support 10 that is configured to receive an electronic device 12 (FIGS. 4-9). Support 10 enables the securing of portable electronic devices for hand free use in a vehicle, at the office, or even at home. Support 10 includes an elongated main body 14 which defines a main body first surface 16, and a main body second surface 18, which is found opposite main body first surface 16. Elongated main body 14 further defines a main body first end 20 and a main body second end 22, which is found opposite main body first end 20.

Support 10 further comprises a first grasping portion 24 which extends from main body first end 20 in a direction opposite main body first surface 16, as well as a second grasping portion 26, which extends from main body second end 22 in a direction opposite main body first surface 16. As best shown in FIG. 3, first and second grasping portions 24, 26 together define a grasping passage 28. Support 10 further comprises a device securing portion 30 (T-shaped portion), which extends from elongated main body 14 in a direction opposite main body second surface 18. Device securing portion 30, together with elongated main body 14, defines first and second securing notches 32, 34, that are designed to receive and secure (hold in place) electronic device 12 inserted therein (FIGS. 4-9), according to two different holding/securing positions. It is to be mentioned that even if two securing notches are illustrated in FIGS. 1-9, a person skilled in the art to which support 10 pertains would understand that only one notch, or more than two notches, may be provided to support and secure electronic device 12.

Still referring to FIGS. 1-3, there is shown that first grasping portion 24 defines a first grasping portion distal end 36, a first grasping portion outer surface 38, and a first grasping portion inner surface 40, which is found opposite first grasping portion outer surface 38. First grasping portion 24 further comprises a plurality of elongated channels 42 (indentations or teeth) about, or extending from, first grasping portion inner surface 40 and first grasping portion distal end 36. Purpose of channels 42 is to prevent support 10 from slipping off from the structure it is grasping when supporting the weight of electronic device 12 (FIGS. 4-9). As shown, first grasping portion 24 defines a substantially elongated and curved shape. However, a person skilled in the art to which support 10 pertains would understand that first grasping portion 24 may adopt any shape, size and/or configuration as long as, together with second grasping portion 26, it allows one to secure, or to mount, support 10 to a structure.

On the other hand, second grasping portion 26 defines a second grasping portion distal end 44, a second grasping portion inner surface 46, and a second grasping portion outer surface 48, which is found opposite second grasping portion inner surface 46. Second grasping portion outer surface 48 is a substantially flat surface and is adapted for supporting elongated main body 14 above a surface. Indeed, according to such configuration, instead of grasping a structure using first and second grasping portions 24, 26, support 10 may be used on a flat surface such as a desk, a table, a countertop, by laying it on this substantially flat surface defined by second grasping portion outer surface 48, which acts, in this scenario, as a base member. As shown, second grasping portion distal end 44 is at a distance 50 from first grasping portion distal end 36, and second grasping portion 26 defines a substantially planar shape. Here again, a person skilled in the art to which support 10 pertains would understand that second grasping portion 26 may adopt any shape, size and/or configuration as long as, together with first grasping portion 24, it allows one to secure, or to mount, support 10 to a structure, and further as it allows one to position support 10 lying on a surface.

Figure 10:
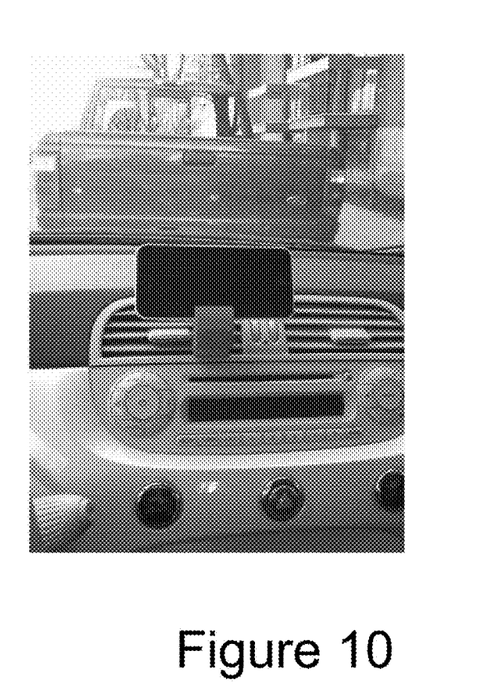
FIG. 10 illustrates a smartphone device being supported by the support shown in FIG. 1, the support being secured to the air vent of a vehicle.
Figure 12:
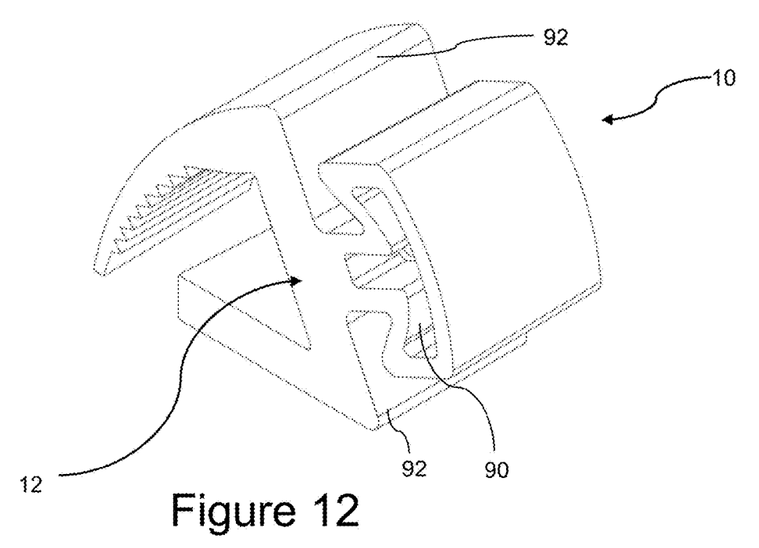
FIG. 12 is a perspective view of a support for an electronic device in accordance with another embodiment.
Figure 13:
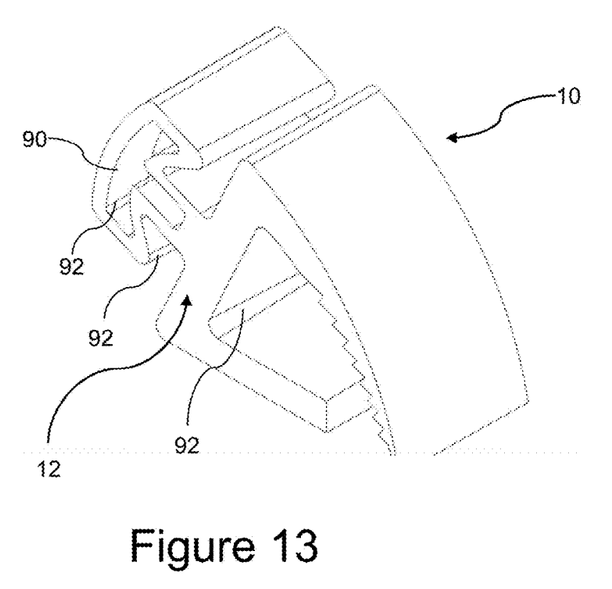
FIG. 13 is another perspective view of the support of FIG. 12.
Figure 14:
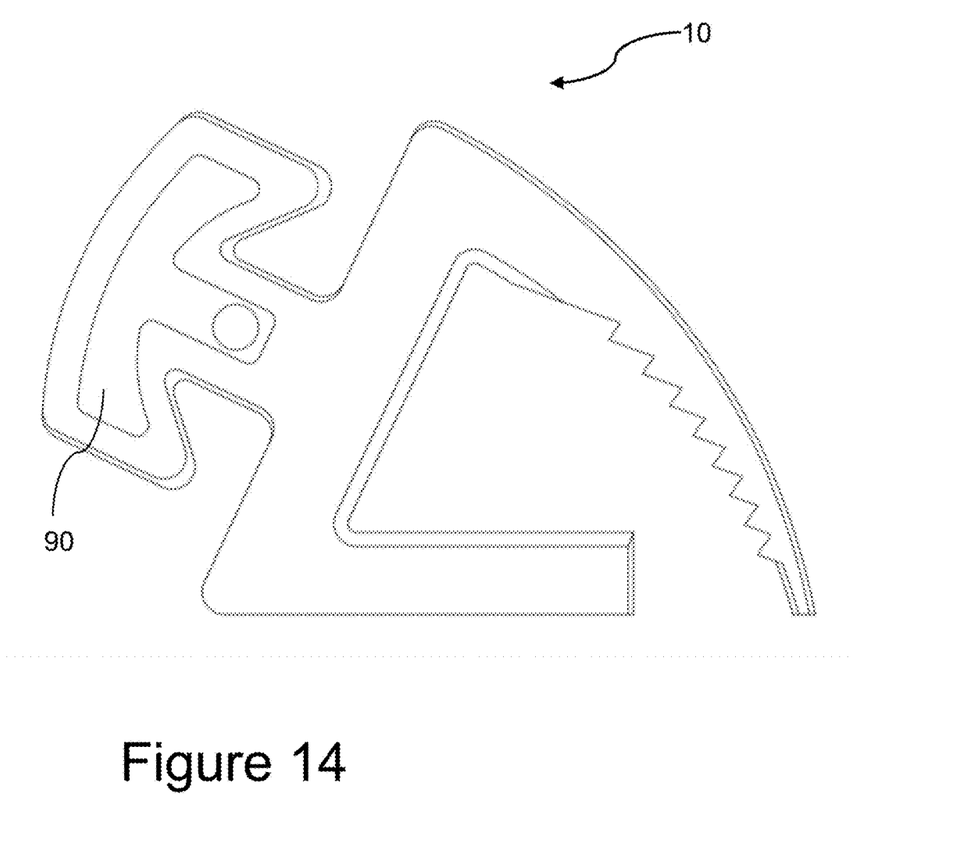
FIG. 14 is a side elevation view of the support of FIG. 12.

Elongated main body 14, first grasping portion 24, second grasping portion 26 and device securing portion 30 are integrally made of a flexible material, such as to allow first and second grasping portions 24, 26 to be pried apart in order to grasp a structure and attach thereon. The structure may be, without limitation, the air vent of a vehicle, as illustrated in FIG. 10, the steering of a vehicle, the dashboard of a vehicle, the inner handle of a vehicle, the heat rest of a vehicle, a bottle neck, a cabinet or refrigerator handle, a laptop screen, and the like. Support 10 is therefore a one-piece construction. The flexible material may include, without limitation, a thermoplastic polyurethane (TPU) material, a silicone material, an ethylene propylene diene terpolymer (EPDM) material, a rubber material, any combination thereof, and the like, as long as the material used may allow elastic deformation of both first and second grasping portions 24, 26 (so they can pivot relatively to main body first and second ends 20, 22 respectively). It is to be mentioned that device securing portion 30 of support 10, as shown in FIGS. 12-14, may include one or more hollow portions 90, as well as flexibility lines, or grooves 92, in a way to increase flexibility of support 10, such as to allow first and second grasping portions 24, 26 to be easily pried apart in order to grasp a structure and attach thereon.

Still referring to FIGS. 1-3, there is shown that device securing portion 30 comprises a securing main portion 52 which extends from elongated main body 14. Securing main portion 52 defines a securing main portion distal end 54, a securing main portion first surface 56 and a securing main portion second surface 58. Device securing portion 30 further comprises a first securing portion 60 which extends from securing main portion distal end 54 in a direction opposite securing main portion first surface 56. First securing portion 60, together with securing main portion first surface 56 and part of main body second surface 18, define first securing notch 32 that is adapted to receive electronic device 12, as it will be described in more details below. Device securing portion 30 further comprises a second securing portion 62, which extends from securing main portion distal end 54 in a direction opposite securing main portion second surface 58. Second securing portion 62, together with securing main portion second surface 58 and part of main body second surface 18, define second securing notch 34, that is also adapted to receive electronic device 12, as it will be described in more details below.

Still referring to FIGS. 1-3, there is shown that first securing portion 60 defines a first securing portion inner surface 64, and that first securing portion inner surface 64 is being at a first angle, which is less than 90°, with respect to securing main portion first surface 56. Similarly, second securing portion 62 defines a second securing portion inner surface 68, which is also at a second angle, which is less than 90°, with respect to securing main portion second surface 58. Even if first and second angles are shown to be about 45°, a person skilled in the art to which support 10 pertains would understand that first and second securing portion inner surfaces 64, 68 may be at any angle that is less than 90° with respect to securing main portion first and second surfaces 56, 58, as long as it adequately secure electronic device 12 to device securing portion 30.

Referring now more particularly to FIGS. 4-9, there is shown an electronic device 12, here illustrated as a smartphone device, that is received within device securing portion 30 of support 10 described above. Smartphone device 12 is illustrated as being positioned in its portrait position in FIGS. 4-6, while smartphone device 12 is illustrated as being positioned in its landscape position in FIGS. 7-9. A person skilled in the art to which support 10 pertains would understand that electronic device 12 may include, without limitation, smartphone devices, tablets, GPS devices and other such devices.

As shown, electronic device 12 defines a device first surface 72 (front surface with screen), a device second surface 74 (rear surface), which is found opposite device first surface 72, as well as four edges 76a, 76b, 76c, 76d, joining device first and second surfaces 72, 74 together. As shown, when electronic device 12 is received within first securing notch 32, main body second surface 18 interfaces with part of device second or rear surface 74, part of securing main portion first surface 56 interfaces with part of edge 76a (when smartphone device is in its portrait position according to FIGS. 4-6) or part of edge 76b (when smartphone device is in its landscape position according to FIGS. 7-9), and part of first securing portion inner surface 64 interfaces with part of device first or front surface 72.

Figure 4:
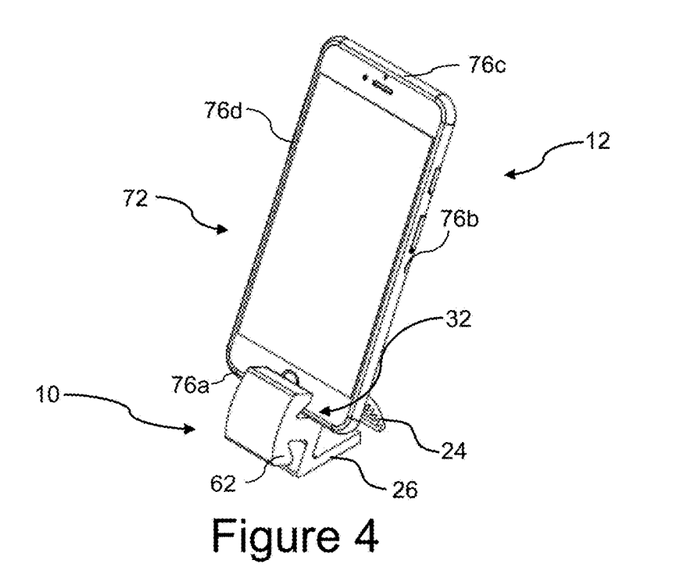
FIG. 4 is a perspective view of a smartphone device being supported by the support shown in FIG. 1, the smartphone device being positioned in its portrait position.
Figure 5:
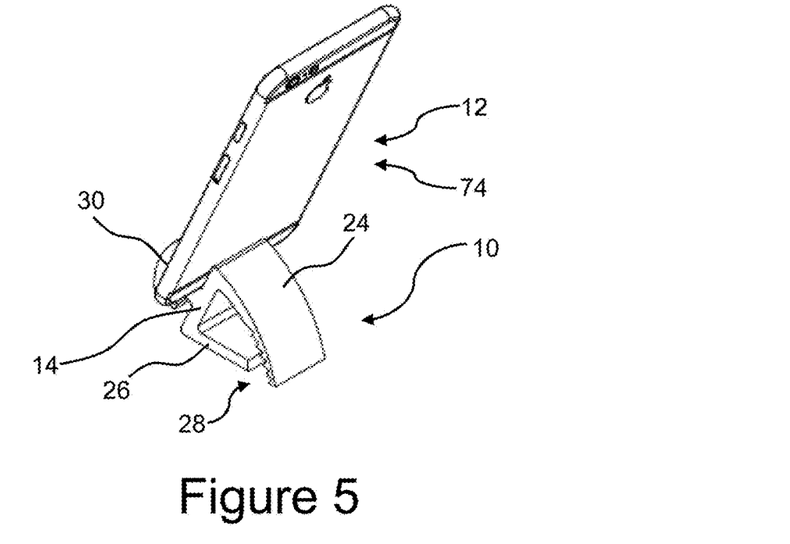
FIG. 5 is another perspective view of the smartphone device being supported by the support shown in FIG. 1, the smartphone device being positioned in its portrait position.
Figure 6:
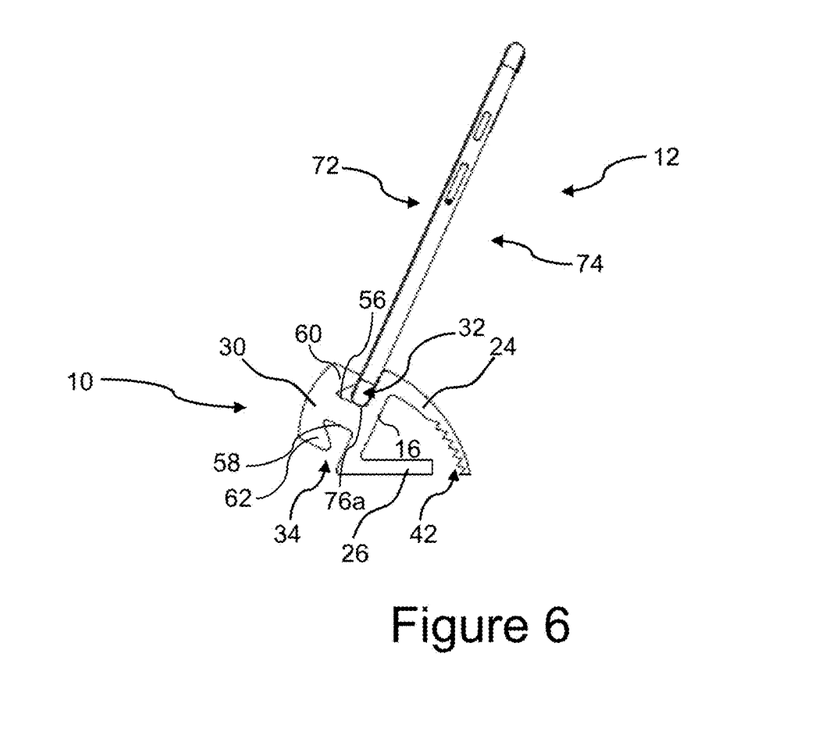
FIG. 6 is a side elevation view of the smartphone device being supported by the support shown in FIG. 1, the smartphone device being positioned in its portrait position.
Figure 7:
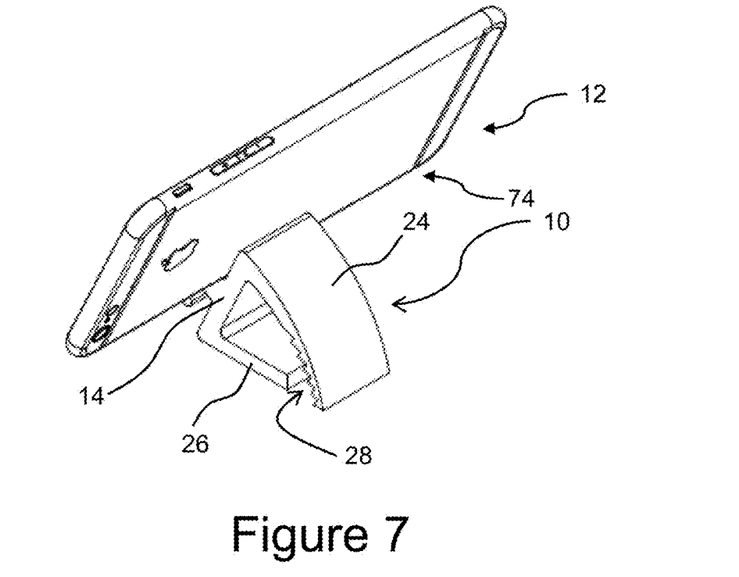
FIG. 7 is a perspective view of the smartphone device being supported by the support shown in FIG. 1, the smartphone device being positioned in its landscape position.
Figure 8:
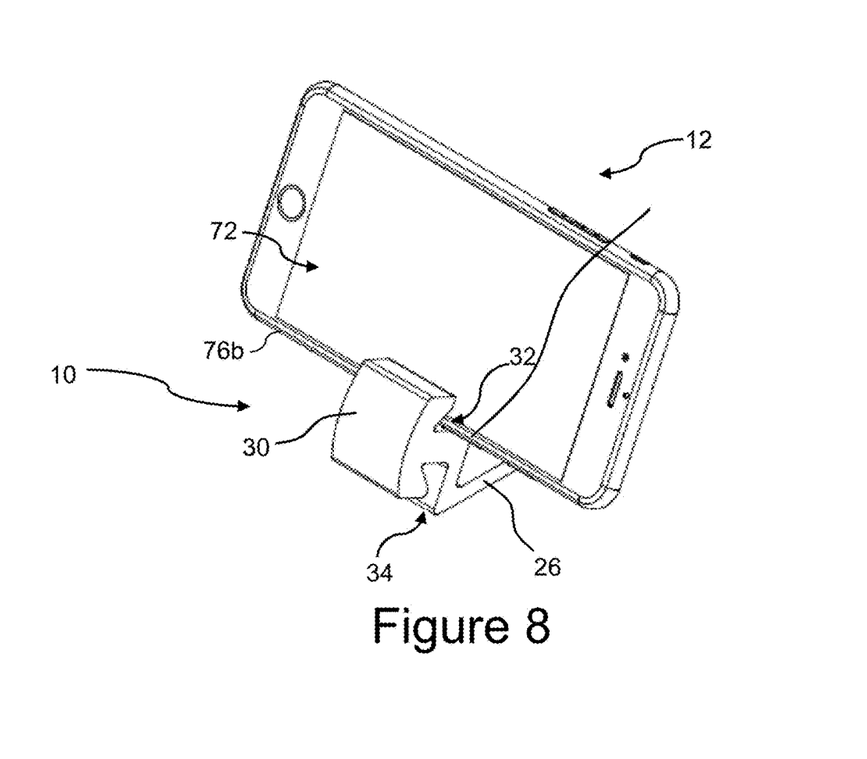
FIG. 8 is another perspective view of the smartphone device being supported by the support shown in FIG. 1, the smartphone device being positioned in its landscape position.
Figure 9:
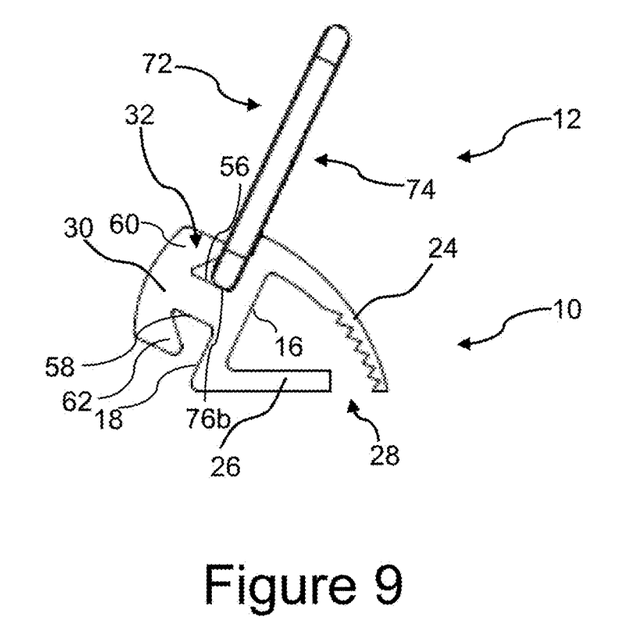
FIG. 9 is a side elevation view of the smartphone device being supported by the support shown in FIG. 1, the smartphone device being positioned in its landscape position.

Similarly but not shown, when electronic device 12 is received within second securing notch 34, main body second surface 18 interfaces with part of device second or rear surface 74, part of securing main portion second surface 58 interfaces with part of edge 76a (when smartphone device is in its portrait position according to FIGS. 4-6) or part of edge 76b (when smartphone device is in its landscape position according to FIGS. 7-9), and part of second securing portion inner surface 68 interfaces with part of device first or front surface 72.

Still referring to FIGS. 1-9, there is shown that first securing portion 60 further defines a first securing portion outer surface 78. First securing portion outer surface 78, together with first securing portion inner surface 64, defines a first securing curved surface 80. Therefore, when electronic device 12 is received within first securing notch 32, first securing curved surface 80 interfaces with part of device first or front surface 72. As shown, first securing portion outer surface 78 is substantially parallel to securing main portion first surface 56.

Similarly, second securing portion 62 further defines a second securing portion outer surface 82. Second securing portion outer surface 82, together with second securing portion inner surface 68, defines a second securing curved surface 84. Thus, when electronic device 12 is received within second securing notch 34 (not shown), second securing curved surface 84 interfaces with part of device first or front surface 72. As shown, second securing portion outer surface 82 is substantially parallel to securing main portion second surface 58.

Figure 11:
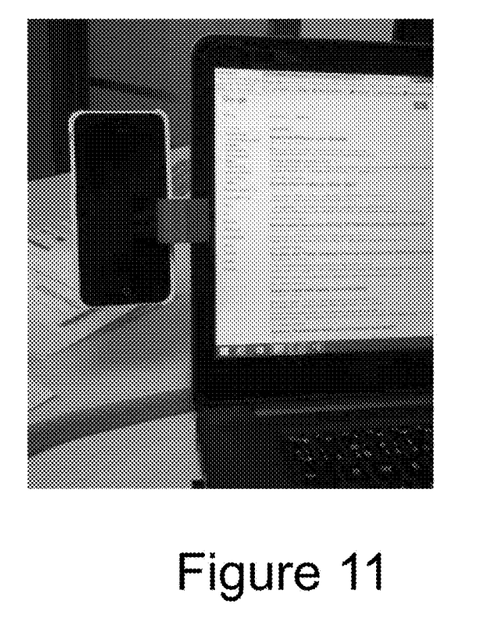
FIG. 11 illustrates a smartphone device being supported by the support shown in FIG. 1, the support being secured to the screen of a laptop computer.

Therefore, support 10 can either be used as a stand, the supported electronic device 12 being inserted into first securing notch 32 (FIGS. 4-9) or used to suspend electronic device 12 using second securing notch 34. Alternatively, one of the opposed first or second securing notch 32 or 34 may be used to support support 10 to a flat screen, the screen of a computer or a laptop computer for example, while the other one of the opposed first or second securing notch 32 or 34 is used for receiving and holding electronic device 12, as illustrated in FIG. 11. The elasticity of the material used for support 10, which is capable of elastic deformation, along with the angle provided to the first and second securing portion inner surfaces 64, 68 (of less than 90°), allow electronic device 10 to slightly tilt so that its edge 76a, 76b, 76c or 76d moves within first or second securing notch 32 or 34, resulting in electronic device 12 remaining secured to support 10.

Thanks to its configuration, support 10 is found to be a universal and versatile support for various types of electronic devices and can be used in a vehicle, at the office, or even at home. Support 10 is further a durable, portable, lightweight and compact support, thanks to its one-piece construction that includes no additional parts or components. It is to be mentioned that even if support 10 is illustrated as supporting an electronic device, support 10 is suitable to support other substantially flat elements such as, without limitation, business cards, pamphlets, restaurant menu and other such printed materials.

While preferred embodiments have been described above and illustrated in the accompanying drawings, it will be evident to those skilled in the art that modifications may be made therein without departing from essence of this disclosure. Such modifications are considered as possible variants comprised in the scope of the disclosure.

The invention claimed is:

1. A support for an electronic device defining a device first surface, a device second surface opposite the device first surface, and four edge joining the device first and second surfaces together, the support comprising:
    an elongated main body defining:
        a main body first surface;
        a main body second surface opposite the main body first surface;
        a main body first end; and
        a main body second end opposite the main body first end;
    a first grasping portion extending from the main body first end in a direction away from the main body first surface;
    a second grasping portion extending from the main body second end in a direction away from the main body first surface, the first and second grasping portions together defining a grasping passage; and
    a device securing portion extending from the elongated main body in a direction away from the main body second surface, the device securing portion together with the elongated main body defining a first securing notch and a second securing notch for receiving the electronic device, the device securing portion comprising:
        a securing main portion extending from the elongated main body and defining:
            a securing main portion distal end;
            a securing main portion first surface; and
            a securing main portion second surface;
        a first portion extending from the securing main portion distal end in a direction away from the securing main portion first surface, the first securing portion together with the securing main portion first surface and part of the main body second surface defining the first securing notch, the first securing portion defining a first securing portion inner surface being at a first angle with the securing main portion first surface; and
        a second securing portion extending from the securing main portion distal end in a direction away from the securing main portion second surface, the second securing portion together with the securing main portion second surface and part of the main body second surface defining the second securing notch, the second securing portion defining a second securing portion inner surface being at a second angle with the securing main portion second surface;
    wherein when the electronic device is received within the first securing notch;
    the main body second surface interface with part of one of: the device first surface and the device second surface;
    part of the securing main portion first surface interface with part of one of the four edges; and
    part of the first securing portion inner surface interface with part of the other one of: the device first surface and the device second surface; and
    further wherein when the electronic device is received within the second securing notch:
    the main body second surface interface with part of one of: the device first surface and the device second surface;
    part of the securing main portion second surface interfaces with part of one of the four edges; and
    part of the second securing portion inner surface interfaces with part of the other one of: the device first surface and the device second surface.

2. The support of claim 1, wherein the first grasping portion comprises:
    a first grasping portion distal end;
    a first grasping portion outer surface;
    a first grasping portion inner surface opposite the first grasping portion outer surface; and
    a plurality of elongated channels about the first grasping portion inner surface and the first grasping portion distal end.

3. The support of claim 1, wherein the first grasping portion defines a substantially elongated and curved shape.

4. The support of claim 2, wherein the second grasping portion comprises:
    a second grasping portion distal end;
    a second grasping portion inner surface; and
    a second grasping portion outer surface opposite the second grasping portion inner surface, the second grasping portion outer surface comprising a substantially flat surface for supporting the elongated main body above a surface.

5. The support of claim 4, wherein the second grasping portion distal end is at a distance from the first grasping portion distal end.

6. The support of claim 4, wherein the second grasping portion defines a substantially planar shape.

7. The support of claim 1, wherein the elongated main body, the first grasping portion, the second grasping portion and the device securing portion are integrally made of a flexible material, thereby allowing the first and second grasping portions to be pried apart in order to grasp a structure and attach thereon.

8. The support of claim 1, wherein the first angle is less than 90°.

9. The support of claim 1, wherein the second angle is less than 90°.

10. The support of claim 1, wherein the first and second angles are about 45°.

11. The support of claim 7, wherein the flexible material comprises at least one of: a thermoplastic polyurethane material, a silicone material, an ethylene propylene diene terpolymer material and a rubber material.

12. The support of claim 1, wherein the first securing portion further defines a first securing portion outer surface, the first securing portion outer surface together with the first securing portion inner surface defining a first securing curved surface, and further wherein when the electronic device is received within the first securing notch, the first securing curved surface interfaces with part of the other one of: the device first surface and the device second surface.

13. The support of claim 12, wherein the first securing portion outer surface is substantially parallel to the securing main portion first surface.

14. The support of claim 12, wherein the second securing portion further defines a second securing portion outer surface, the second securing portion outer surface together with the second securing portion inner surface defining a second securing curved surface, and further wherein when the electronic device is received within the second securing notch, the second securing curved surface interfaces with part of the other one of: the device first surface and the device second surface.

15. The support of claim 14, wherein the second securing portion outer surface is substantially parallel to the securing main portion second surface.

* * * * *